United States Patent
Kuppambatti

(10) Patent No.: US 10,483,916 B2
(45) Date of Patent: Nov. 19, 2019

(54) SYSTEMS AND METHODS FOR RING-OSCILLATOR BASED OPERATIONAL AMPLIFIERS FOR SCALED CMOS TECHNOLOGIES

(71) Applicant: Seamless Microsystems, Inc., Santa Clara, CA (US)

(72) Inventor: Jayanth Kuppambatti, San Jose, CA (US)

(73) Assignee: SEAMLESS MICROSYSTEMS, INC., Santa Clara, CA (US)

( * ) Notice: Subject to any disclaimer, the term of this patent is extended or adjusted under 35 U.S.C. 154(b) by 0 days.

(21) Appl. No.: 16/057,519

(22) Filed: Aug. 7, 2018

(65) Prior Publication Data

US 2018/0351513 A1    Dec. 6, 2018

Related U.S. Application Data

(62) Division of application No. 15/408,058, filed on Jan. 17, 2017, now Pat. No. 10,075,133.

(Continued)

(51) Int. Cl.
*H03F 1/02* (2006.01)
*H03F 1/56* (2006.01)

(Continued)

(52) U.S. Cl.
CPC ........... *H03F 1/0205* (2013.01); *G04F 10/06* (2013.01); *H03F 1/56* (2013.01); *H03F 3/193* (2013.01);

(Continued)

(58) Field of Classification Search
CPC .................................................... H03F 1/0205

(Continued)

(56) References Cited

U.S. PATENT DOCUMENTS 5,117,132 A    5/1992   Watson et al.
5,228,138 A    7/1993   Pratt et al.
(Continued)

FOREIGN PATENT DOCUMENTS

EP    2773046 A2    9/2014

OTHER PUBLICATIONS

Aoki, I., et al., "A Fully-Integrated Quad-Band GSM/GPRS CMOS Power Amplifier," IEEE Journal Solid-State Circuits, vol. 43, No. 12, pp. 2747-2758 (Dec. 2008) (12 pages).

(Continued)

*Primary Examiner* — Joseph Chang
(74) *Attorney, Agent, or Firm* — Wilmer Cutler Pickering Hale and Dorr LLP

(57) ABSTRACT

An area efficient amplifier that amplifies a continuous-time continuous-amplitude signal and converts it to a discrete-time discrete-amplitude signal. The amplifier includes a first oscillator having an input and a plurality of N outputs and a second oscillator having an input and N outputs. The amplifier includes N phase detectors, each phase detector has a first input, a second input, a first output, and a second output, where each first input of each phase detector is coupled to respective one of the N outputs of the first oscillator, where each second input of each phase detector is coupled to respective one of the N outputs of the second oscillator. The amplifier includes N quantizers, each quantizer has a data input, a clock input, and an output, where each data input of each quantizer is coupled to respective one first output or one second output of the N phase detectors.

13 Claims, 11 Drawing Sheets

Related U.S. Application Data

(60) Provisional application No. 62/279,445, filed on Jan. 15, 2016, provisional application No. 62/279,448, filed on Jan. 15, 2016.

(51) Int. Cl.
*H03F 3/193* (2006.01)
*H03F 3/21* (2006.01)
*H03F 3/45* (2006.01)
*G04F 10/06* (2006.01)
*H03K 7/08* (2006.01)
*H03M 1/60* (2006.01)
*H03K 3/03* (2006.01)

(52) U.S. Cl.
CPC ........... *H03F 3/21* (2013.01); *H03F 3/45179* (2013.01); *H03K 7/08* (2013.01); *H03M 1/60* (2013.01); *H03F 2200/387* (2013.01); *H03F 2200/451* (2013.01); *H03K 3/0315* (2013.01); *H03K 3/0322* (2013.01)

(58) Field of Classification Search
USPC .......................................................... 330/253
See application file for complete search history.

(56) References Cited

U.S. PATENT DOCUMENTS

| | | | |
|---|---|---|---|
| 5,949,292 | A | 9/1999 | Fahrenbruch et al. |
| 9,048,858 | B1 | 6/2015 | Nidhi |
| 2010/0109713 | A1 | 5/2010 | Harriman |
| 2012/0154192 | A1 | 6/2012 | Op 'T Eynde |
| 2015/0180500 | A1 | 6/2015 | Kropfitsch et al. |
| 2016/0226451 | A1 | 8/2016 | Vigraham et al. |

OTHER PUBLICATIONS

Drost, B., et al., "Analog Filter Design Using Ring Oscillator Integrators," IEEE Journal of Solid-State Circuits, vol. 47, No. 12, pp. 3120-3129 (Dec. 2012) (10 pages).

Vigraham, B., et al., "Swithced-Mode Operational Amplifiers and Their Application to Continuous-Time Filters in Nanoscale CMOS," IEEE Journal of Solid-State Circuits, vol. 49, No. 12, pp. 1-15 (Dec. 2014), IEEE Proof Web Version (15 pages).

Yoo, S.-M., et al., "A Switched-Capacitor RF Power Amplifier," IEEE Journal of Solid-State Circuits, vol. 46, No. 12, Author Manuscript, pp. 1-34 (Dec. 2011) (34 pages).

International Search Report and Written Report issued by the U.S. Patent and Trademark Office as International Searching Authority, issued in International Application PCT/US2017/013768, dated May 4, 2017 (13 pages).

European Extended Search Report issued in EP17739151.3. dated Jul. 30, 2019 (11 pages).

Kim, T. et al., "High-Speed and High-Linearity Ring Oscillator Based Pulse Width Modulator", 2015 IEEE International Symposium on Circuits and Systems (ISCAS), pp. 2253-2256, May 24, 2015 (4 pages).

SYSTEMS AND METHODS FOR RING-OSCILLATOR BASED OPERATIONAL AMPLIFIERS FOR SCALED CMOS TECHNOLOGIES

CROSS-REFERENCE TO RELATED APPLICATIONS

This application is a divisional application of U.S. patent application Ser. No. 15/408,058, filed on Jan. 17, 2017, which claims the benefit of U.S. Provisional Application No. 62/279,445, filed on Jan. 15, 2016 and U.S. Provisional Application No. 62/279,448, filed on Jan. 15, 2016. All of the aforementioned applications are incorporated by reference herein in their entireties.

TECHNICAL FIELD

The present disclosure generally relates to amplifier, and more specifically to ring-oscillator based operational amplifier.

BACKGROUND

The continuous technology scaling has made the design of amplifiers in nanoscale CMOS very challenging. Nanoscale CMOS technologies are characterized not only by smaller transistor sizes but also by shrinking supply voltages. Thus, conventional amplifier design techniques, where amplifiers are designed by representing signal information in the voltage and current domains, suffer from a number of disadvantages in scaled technologies. For example, the shrinking power supply voltage leads to limited voltage headroom, and hence a large power consumption is required to achieve a certain signal-to-noise ratio (SNR) because of signal swing limitations. The shrinking power supply voltage also leads to poor linearity. In addition, the intrinsic gain of transistors degrades in scaled CMOS technologies.

Recently, techniques have been proposed to design amplifiers that largely address the limitations of conventional design techniques in the following references: B. Drost et. al, "Analog Filter Design Using Ring Oscillator Integrators," IEEE Journal of Solid-State Circuits, vol. 47, no. 12, December 2012 (hereinafter "Drost"); B. Vigraham et. al, "Switched-Mode Operational Amplifiers and Their Application to Continuous-Time Filters in Nanoscale CMOS," IEEE Journal of Solid-State Circuits, vol. 49, no. 12, December 2014 (hereinafter "Vigraham I"); and B. Vigraham et. al, "Circuits and Methods for Switched-Mode Operational Amplifiers," US Patent No. 2016/0226451A1 (hereinafter "Vigraham II"). By exploiting the faster devices available in scaled CMOS technologies, Drost, Vigraham I, and Vigraham II propose amplifiers that represent signal information in the time domain, rather than the voltage and current domains as used by conventional design techniques. But, the designs proposed in Drost suffers from poor linearity, resulting from its inherent "open-loop" structure. The design proposed in Vigraham I and Vigraham II, while addressing the linearity concerns in Drost, suffer from increased complexity leading to larger circuit area and power consumption.

We propose Ring-Oscillator operational amplifiers to address voltage headroom challenges for analog design in scaled CMOS technologies, as well addressing the limitations of Dorst, Vigraham I, and Vigraham II.

SUMMARY

One aspect discussed herein related to an area efficient amplifier that amplifies a continuous-time continuous-amplitude signal and converts the continuous-time continuous-amplitude signal to a discrete-time discrete-amplitude signal. The amplifier includes a first oscillator having an input and a plurality of N outputs. The amplifier includes a second oscillator having an input and a plurality of N outputs. The amplifier includes a plurality of N phase detectors, each phase detector has a first input, a second input, a first output, and a second output, where each first input of each phase detector is coupled to respective one of the plurality of N outputs of the first oscillator, where each second input of each phase detector is coupled to respective one of the plurality of N outputs of the second oscillator. The amplifier includes a plurality of N quantizers, each quantizer has a data input, a clock input, and an output, where each data input of each quantizer is coupled to respective (1) one first output of the plurality of N phase detectors or (2) one second output of the plurality of N phase detectors.

In some embodiments, at least one of the first oscillator or the second oscillator is a voltage controlled oscillator.

In some embodiments, at least one of the first oscillator or the second oscillator is a current controlled oscillator.

In some embodiments, at least one of the first oscillator or the second oscillator is a ring oscillator.

In some embodiments, at least one of the first oscillator or the second oscillator is a single-ended oscillator.

In some embodiments, the first oscillator and the second oscillator form a differential oscillator.

In some embodiments, at least one of the plurality of N phase detectors is an exclusive OR gate.

In some embodiments, at least one of the plurality of N quantizers is a D flip-flop.

In some embodiments, at least one of the plurality of N quantizers is a JK flip-flop.

In some embodiments, at least one of the plurality of N quantizers is a toggle flip-flop.

Another aspect discussed herein related to a closed loop amplifier that amplifies a continuous-time continuous-amplitude signal to a continuous-time discrete-amplitude signal. The amplifier includes a first oscillator having an input and a plurality of N outputs. The amplifier includes a second oscillator having an input and a plurality of N outputs. The amplifier includes a plurality of N phase detectors, each of the plurality of N phase detectors has a first input, a second input, a first output, and a second output, where each first input of each phase detector is coupled to respective one of the plurality of N outputs of the first oscillator, where each second input of each phase detector is coupled to respective one of the N outputs of the second oscillator. The amplifier includes a first impedance element having two terminals, where one terminal is coupled to the input of the first oscillator. The amplifier includes a second impedance element having two terminals, where one terminal is coupled to the input of the second oscillator. The amplifier includes a plurality of N third impedance elements, each of the plurality of N third impedance elements has a first terminal and a second terminal, where each first terminal of each third impedance element is coupled to the input of the first oscillator, where each second terminal of each third impedance element is coupled to respective one first output of the plurality of N phase detectors. The amplifier includes a plurality of N fourth impedance elements, each of the plurality of N fourth impedance elements has a first terminal and a second terminal, where each first terminal of each fourth impedance element is coupled to the input of the second oscillator, where each second terminal of each fourth impedance element is coupled to respective one second output of the plurality of N phase detectors.

In some embodiments, at least one of the first oscillator or the second oscillator is a voltage controlled oscillator.

In some embodiments, at least one of the first oscillator or the second oscillator is a current controlled oscillator.

In some embodiments, at least one of the first oscillator or the second oscillator is a ring oscillator.

In some embodiments, at least one of the first oscillator or the second oscillator is a single-ended oscillator.

In some embodiments, the first oscillator and the second oscillator form a differential oscillator.

In some embodiments, at least one of the plurality of N phase detectors is an exclusive OR gate.

In some embodiments, the first impedance element and the second impedance element have the same impedance value.

In some embodiments, each of the plurality of N third impedance elements and each of the plurality of N fourth impedance elements have the same impedance value.

In some embodiments, the first impedance element and the second impedance element are resistors.

In some embodiments, the first impedance element and the second impedance element are capacitors.

In some embodiments, each of the plurality of N third impedance elements and each of the plurality of N fourth impedance elements are resistors.

In some embodiments, each of the plurality of N third impedance elements and each of the plurality of N fourth impedance elements are capacitors.

Yet another aspect discussed herein related to an area efficient amplifier that amplifies a continuous-time continuous-amplitude signal to a continuous-time discrete-amplitude signal. The amplifier includes a first oscillator having an input and a plurality of N outputs. The amplifier includes a second oscillator having an input and a plurality of N outputs. The amplifier includes a plurality of N phase detectors, each phase detector has a first input, a second input, a first output, and a second output, where each first input of each phase detector is coupled to respective one of the plurality of N outputs of the first oscillator, where each second input of each phase detector is coupled to respective one of the plurality of N outputs of the second oscillator.

In some embodiments, at least one of the first oscillator or the second oscillator is a voltage controlled oscillator.

In some embodiments, at least one of the first oscillator or the second oscillator is a current controlled oscillator.

In some embodiments, at least one of the first oscillator or the second oscillator is a ring oscillator.

In some embodiments, at least one of the first oscillator or the second oscillator is a single-ended oscillator.

In some embodiments, the first oscillator and the second oscillator form a differential oscillator In some embodiments, at least one of the plurality of N phase detectors is an exclusive OR gate.

Elements of embodiments described with respect to a given aspect of the invention may be used in various embodiments of another aspect of the invention. For example, it is contemplated that features of dependent claims depending from one independent claim can be used in apparatus and/or methods of any of the other independent claims.

BRIEF DESCRIPTION OF FIGURES

The foregoing and other objects, aspects, features, and advantages of the present disclosure will become more apparent and better understood by referring to the following description taken in conjunction with the accompanying drawings, in which.

Figure 1A:
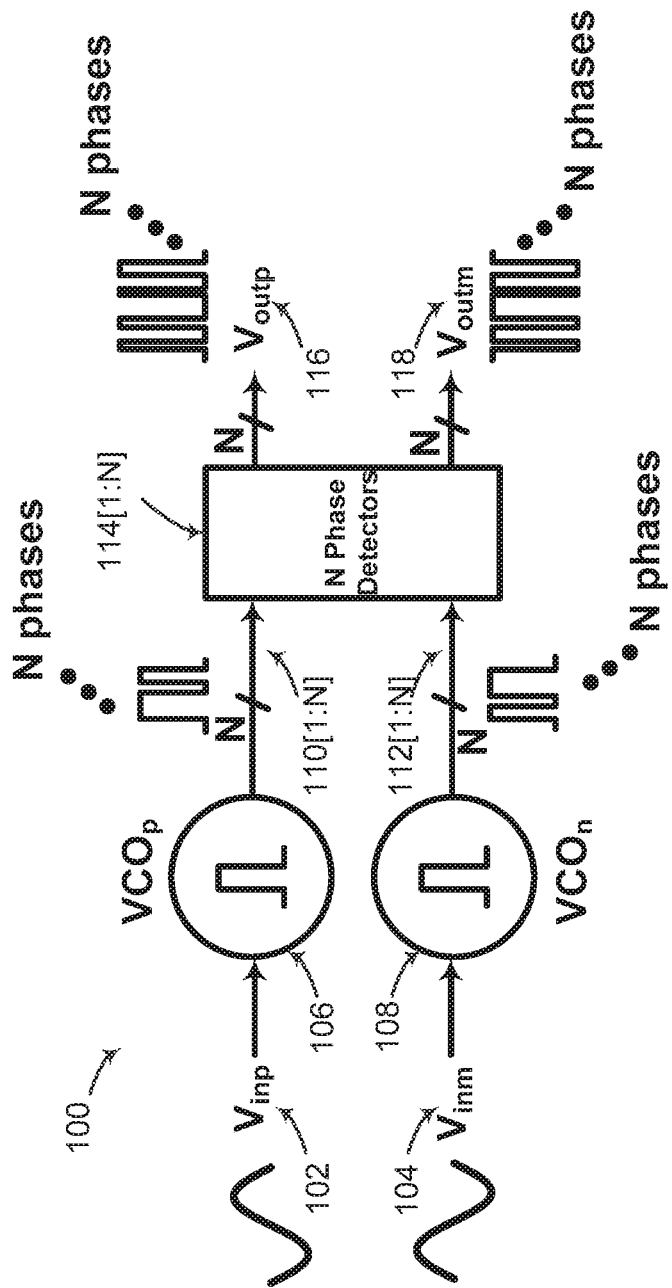
FIG. 1A illustrates a ring oscillator based operational amplifier according to certain embodiments of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

In the following description, numerous specific details are set forth regarding the systems, methods and media of the disclosed subject matter and the environment in which such systems, methods and media may operate, etc., in order to provide a thorough understanding of the disclosed subject matter. It will be apparent to one skilled in the art, however, that the disclosed subject matter may be practiced without such specific details, and that certain features, which are well known in the art, are not described in detail in order to avoid complication of the disclosed subject matter. In addition, it will be understood that the examples provided below are exemplary, and that it is contemplated that there are other systems, methods and media that are within the scope of the disclosed subject matter.

Ring-oscillator based operational amplifiers (ROAMPs) can be used to implement power-efficient high-performance general purpose amplifiers in scaled CMOS technologies. The input differential signal is used to frequency modulate at least two voltage or current controlled ring oscillators, by feeding it to the frequency control inputs of the ring-oscillators. The frequency modulated outputs of the ring-oscillator are then fed to a phase detector. The phase detector compares the outputs of the at least two ring-oscillators and produces a pulse-width modulated output where the signal information, which is in the voltage or current domain at the input, is encoded in the pulse-widths domain. The output of the phase detector is an integrated and amplified version of the input differential signal. The ring-oscillator based amplifiers forms a single-pole amplifier with infinite DC gain, due to the ideal voltage-to-phase integration of the ring-oscillator, whose bandwidth is set by the tuning gain of the oscillator ($K_v$ in Hz/V) and the phase detector gain ($K_{PD}$ in V/radian).

ROAMPs can be used to implement general purpose amplifiers. When used with appropriate feedback elements (e.g., resistors, capacitors, and/or other suitable elements), ROAMPs can implement closed-loop amplifiers, used in ADCs, filters, sensing amplifiers, and/or other suitable circuits. The outputs of ROAMPs, being pulse-width modulated signals, can be sampled by simple digital flip-flops to implement quantization, thus implementing both an amplifier and an analog-to-digital converter.

By using a pulse-width representation for its output, ROAMPs can achieve rail-to-rail signal swing, a very critical advantage in the low supply voltage regimes of scaled CMOS technologies. ROAMPs also offer significant advantages compared to previous time-domain amplification efforts in Drost, Vigraham I, and Vigraham II. By using at least two simple ring-oscillators and a phase detector to implement ideal integration and voltage to phase conversion, ROAMPs offer a very low-complexity design with very efficient power and area consumption. ROAMPs are also very amenable to implementing feedback network insensitive closed-loop amplifiers, in complete contrast to Drost.

FIG. 1A shows a ring-oscillator (RO) operational amplifier 100 according to certain embodiments of the present disclosure. The amplifier 100 includes two voltage-controlled oscillators (VCO) $VCO_p$ 106 and $VCO_n$ 108, and a plurality of N phase detectors (PD) 114[1:N]. Each of the $VCO_p$ 106 and $VCO_n$ 108 has a plurality of N outputs. In some embodiments, N is less than 256. The operational amplifier 100 has two differential inputs $V_{inp}$ 102 and $V_{inm}$ 104. In some embodiments, $V_{inp}$ 102 and $V_{inm}$ 104 are analog signals. $V_{inp}$ 102 is the input of $VCO_p$ 106, and $V_{inm}$ 104 is the input of $VCO_n$ 108. The N-phase outputs of $VCO_p$ 106 are 110[1:N], and the N-phase outputs of $VCO_n$ 108 are 112[1:N]. Both signals 110[1:N] and 112[1:N] are frequency modulated signals. The output frequencies of $VCO_p$ 106 and $VCO_n$ 108 depend on the input signals $V_{inp}$ 102 and $V_{inm}$ 104, and are given by $F_{outp}=V_{inp}K_v$ and $F_{outm}=V_{inm}K_v$ while the output phase of the two VCOs are given by $\phi_{outp}=K_v \int V_{inp}$ and $\phi_{outm}=K_v \int V_{inm}$, where $K_v$ is the VCO tuning gain in Hz/V. The VCOs are usually implemented as an N-phase ring oscillator with N output phases. The N output phases of $VCO_p$ and $VCO_m$ are compared against each other using the N PD 114[1:N] that perform phase domain subtraction, generating the output signals $V_{outp}$ 116[1:N] and $V_{outm}$ 118[1:N], which are rail-to-rail binary switched pulse-width modulated signals. In some embodiments, each of the N phase detectors 114[1:N] is coupled to respective one phase output of the $VCO_p$ and one phase output of the $VCO_m$. For example, if $VCO_p$ and $VCO_m$ have N phase outputs, then there will be N phase detectors 114[1:N]. For example, the first phase detector 114[1] receives the first phase output of $VCO_p$ and the first phase output of $VCO_m$; the second phase detector 114[2] receives the second phase output of $VCO_p$ and the second phase output of $VCO_m$; and the $N^{th}$ phase detector 114[N] receives the $N^{th}$ phase output of $VCO_p$ and the $N^{th}$ phase output of $VCO_m$. The signal information is encoded in the output signals $V_{outp}$ 116[1:N] and $V_{outm}$ 118[1:N] in their pulse-widths, and the peak signal swing is limited by the minimum pulse-width the circuit can represent, which improves with CMOS scaling. This achieves close to rail-to-rail swings at low supply voltages. In some embodiments, the amplifier 100 can include more than two VCOs. Although FIG. 1A uses voltage controlled ring oscillators for 106 and 108, current controlled oscillators or any other usable types of frequency controlled oscillators can also be used. In FIG. 1A, signals 110[1:N], 112[1:N], 116[1:N], and 118[1:N] are N-width buses. In some embodiments, the amplifier 100 amplifies a continuous-time continuous-amplitude signal to a continuous-time discrete-amplitude signal. In some embodiments, the amplifier only includes the blocks shown in FIG. 1A—two N-phase oscillators and N phase detectors.

Figure 1B:
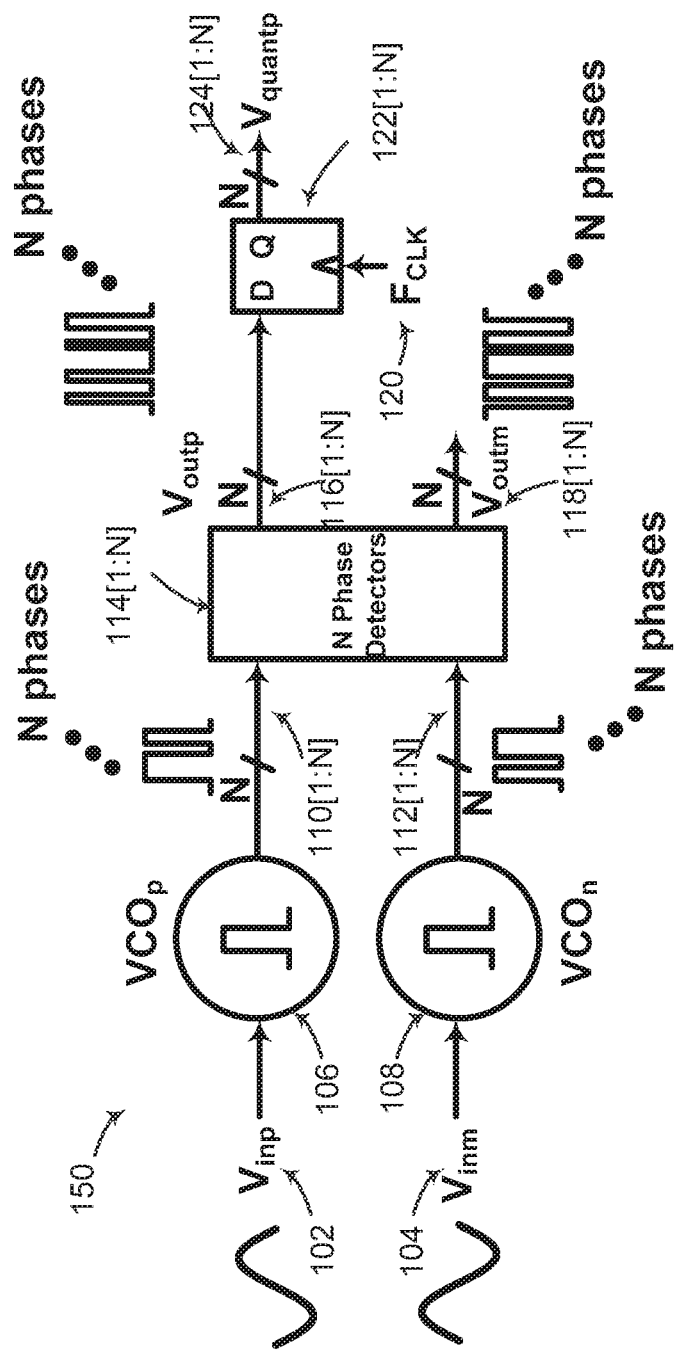
FIG. 1B illustrates a ring oscillator based operational amplifier according to certain embodiments of the present disclosure.

FIG. 1B shows a ring-oscillator (RO) operational amplifier 150 that includes N simple digital flip-flops 122[1:N] that implement N quantizers. In some embodiments, other type of quantizers, such as comparators, can be used as well. In FIGS. 1A and 1B, the same reference numerals indicate the same elements. In some embodiments, the amplifier 150 is the amplifier 100 followed by N flip-flops 122[1:N]. In some embodiments, each of the N phase detector 114[1:N] is coupled to respective one of the N flip-flops 122[1:N]. For example, one output of the first phase detector 114[1], 116[1], is coupled to the input of the first flip-flop 122[1]; one output of the second phase detector 114[2], 116[2], is coupled to the input of the second flip-flop 122[2]; and one output of the $N^{th}$ phase detector 114[N], 116[N], is coupled to the input of the $N^{th}$ flip-flop 122[N]. The flip-flops 122[1:N] are shown as D flip-flops, but they can be implemented by JK flip-flops (with J and K inputs tied together and fed with the data signal) toggle flip-flops, or any other suitable flip-flops. In some embodiments, each of the N flip-flops 122[1:N] has at least one data input, one clock input, and one output. One or both of the outputs of the phase detector 114[1:N], $V_{outp}$ 116[1:N], contain signal information in the time-domain encoded as pulse-widths. $V_{outp}$ 116[1:N] is fed to the flip-flop 122 that is clocked using a sample clock $F_{CLK}$ 120. The flip-flop 122[1:N] quantizes the pulse-widths of $V_{outp}$ 116[1:N] in accordance to the sampling clock $F_{CLK}$ to produce the digital signal $V_{quantp}$ 124 [1:N], thereby implementing an analog-to-digital converter. In some embodiments, additional or alternative flip-flops can also be used to quantize $V_{outm}$. In FIG. 1B, signals 110[1:N], 112[1:N], 116[1:N], 118[1:N], and 124[1:N] are N-width buses. In some embodiments, the amplifier 150 amplifies a continuous-time continuous-amplitude signal and converts the continuous-time continuous-amplitude signal to a discrete-time discrete-amplitude signal.

Figure 2A:
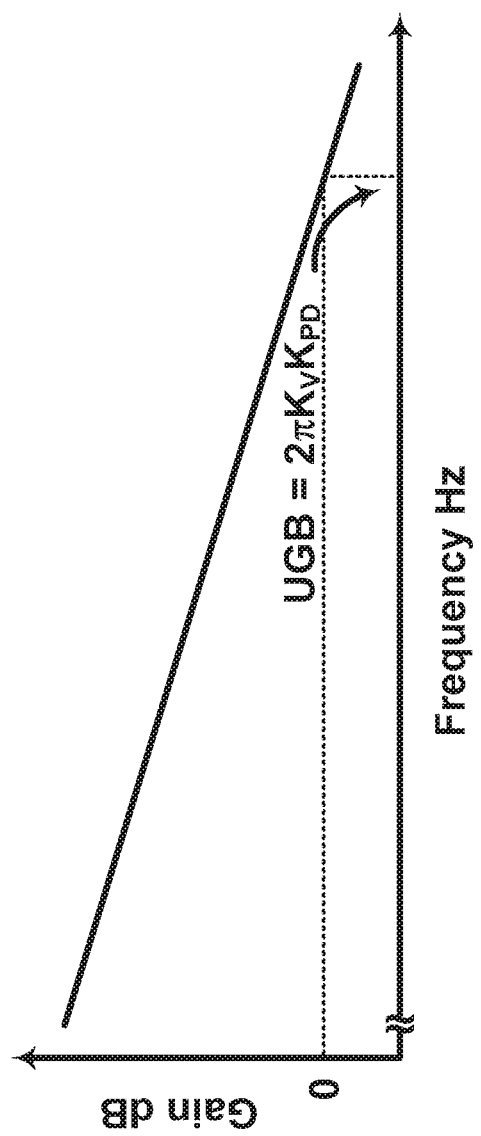
FIG. 2A illustrates a frequency response of the gain of a ring oscillator based operational amplifier according to certain embodiments of the present disclosure.

FIG. 2A shows the frequency response of the gain of the amplifier 100 shown in FIG. 1A or the amplifier 150 shown in FIG. 1B. FIG. 2A is the frequency response from the input ($V_{inp}-V_{inm}$) to the output ($V_{outp}-V_{outm}$). The x axis shows frequency in Hz, and the y axis shows gain in dB. The amplifier 100 in FIG. 1A acts like an ideal integrator with infinite DC gain, due to the ideal voltage to phase integration performed by the $VCO_p$ 106 and $VCO_n$ 108. The unity-gain bandwidth (UGB), which is the frequency at which the gain of the amplifier is 1 or 0 dB, of the amplifier is given by $2\pi K_v K_{PD}$, where $K_{PD}$ is the gain of the phase detector in V/radian.

Figure 2B:
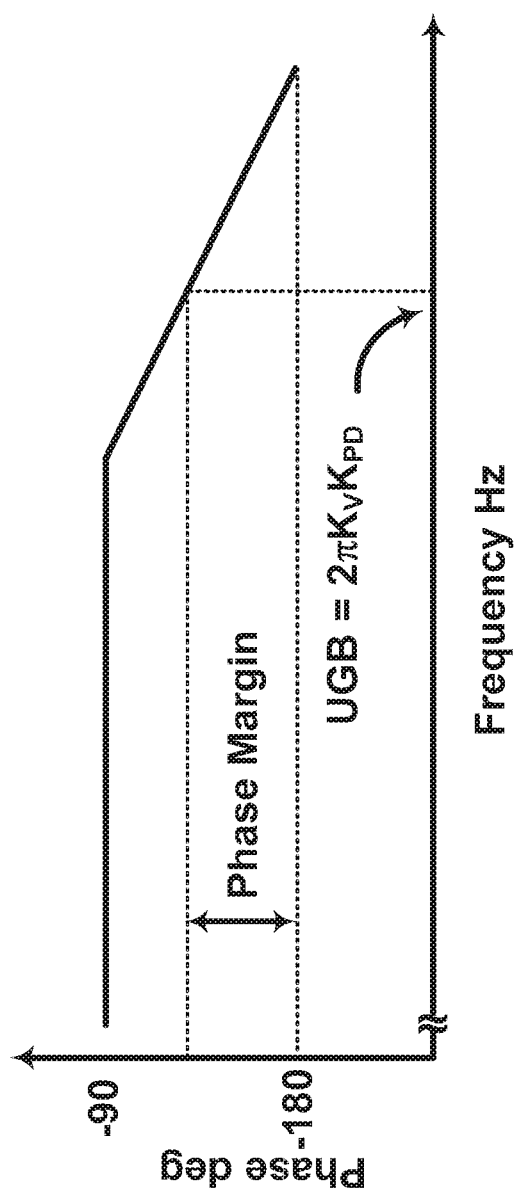
FIG. 2B illustrates a frequency response of the phase of a ring oscillator based operational amplifier according to certain embodiments of the present disclosure.

FIG. 2B shows the frequency response of the phase shift of the amplifier 100 shown in FIG. 1A or the amplifier 150 shown in FIG. 1B. FIG. 2A is the frequency response from the input ($V_{inp}-V_{inm}$) to the output ($V_{outp}-V_{outm}$). The x-axis shows frequency in Hz, and they axis shows phase in degree. The phase shift at the output of the amplifier 100 starts off at −90° due to the ideal integration performed by the VCOs and begins a linear roll-off with respect to frequency due to the delay of the phase detector. The maximum achievable UGB is limited by the VCO tuning gain $K_V$ and the achievable phase margin, which is the difference between the phase difference of the output of the ROAMP and input signal at the UGB and −180 degrees, is limited by the delay $t_d$ of the phase detector. The delay $t_d$ of the phase detector is the propagation delay, i.e. amount of time it takes for a transition at the input of the phase detector to propagate to the output of the phase detector. The delay $t_d$ affects the phase margin of the amplifier i.e. how far the phase shift of the amplifier is from 180 degrees. A lower $t_d$ causes higher phase margin, which leads to a more stable amplifier and the opposite is true for a higher $t_d$. In scaled CMOS technologies, $K_V$ increases and $t_d$ reduces thus the stable UGB of the amplifier of FIG. 1A improves with technology scaling.

Figure 3A:
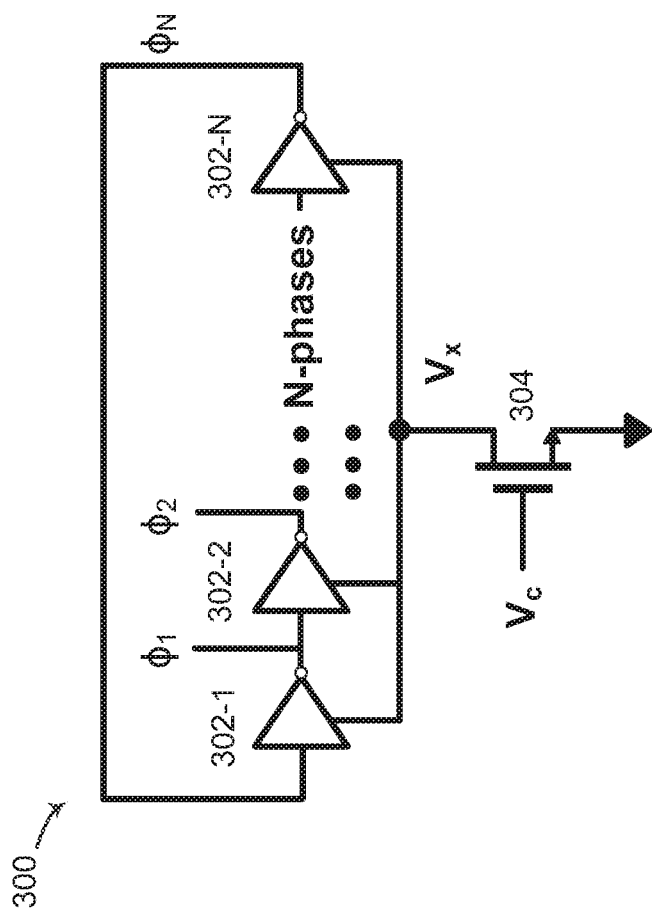
FIG. 3A illustrates a ring oscillator according to certain embodiments of the present disclosure.

FIG. 3A illustrates a multi-phase VCO 300 according to certain embodiments of the present disclosure. VCO 300 is a single-ended implementation of the multi-phase voltage-controlled ring-oscillators used in FIGS. 1A and 1B, implemented using N simple identical static inverters 302 (302-1, 302-2, . . . , and 302-N). N is an integer greater than 2. In a single-ended implementation, N can be odd while in a differential implementation, N can be odd or even. In some embodiments, the VCO 300 has one input and N-outputs. $\phi_1$, $\phi_2$ . . . $\phi N$ are the N-phase outputs of the oscillator. VCO 300 also includes a tail current source 304, which controls the frequency of oscillation according to the control input signal $V_c$. The control input $V_c$ sets the bias current of the tail current source 304. If $V_c$ is high, the bias current source 304 draws more current and hence the VCO oscillates faster. When VCO 106 in FIG. 1A is implemented by the VCO 300, the input signal 102 is connected to $V_c$, and the N outputs of the VCO 300, $\phi_1$, $\phi_2$, . . . $\phi N$, are connected N-width bus 110 in FIG. 1A. In some embodiments, the VCO 300 may also be implemented in a differential fashion.

Figure 3B:
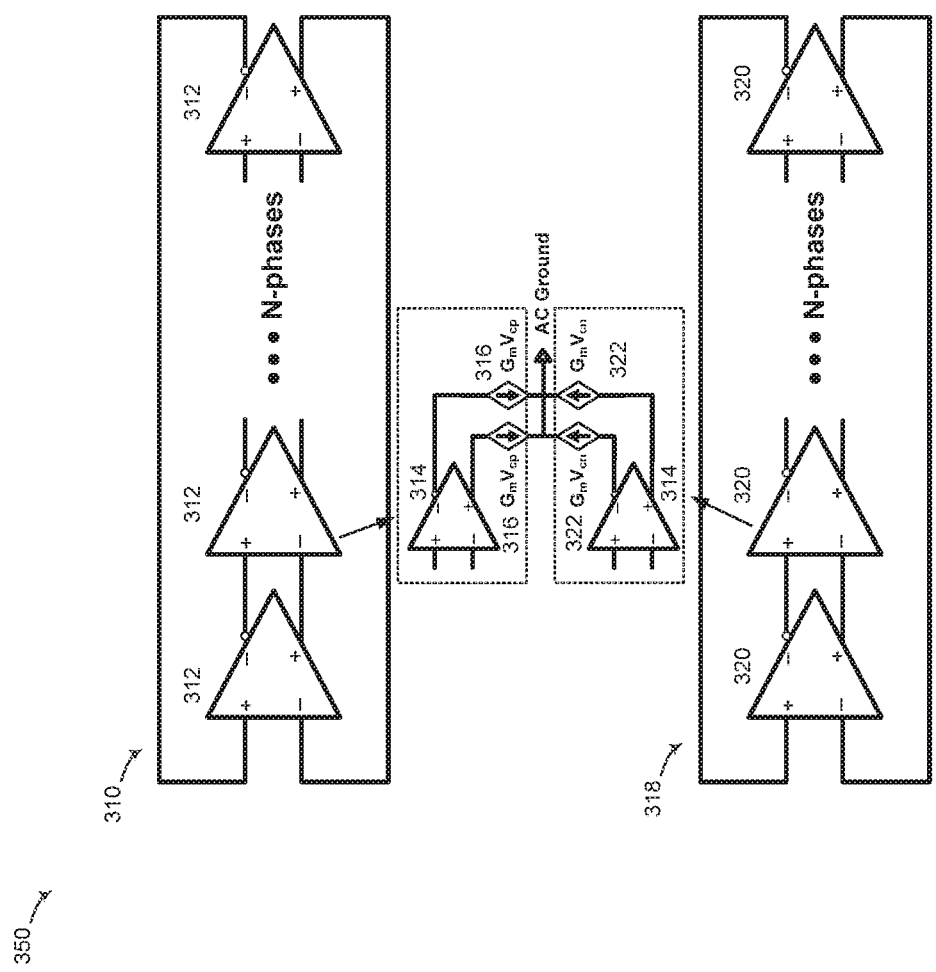
FIG. 3B illustrates a ring oscillator according to certain embodiments of the present disclosure.

FIG. 3B shows a fully differential implementation of the N-phase VCOs (106 and 108 in FIG. 1A), for the case when the integer N is even (if N is odd, the connections between the last and first stage of the VCO will need to be inverted) according to certain embodiments of the present disclosure. The fully differential VCOs 310 and 318 are identical to each other except that the frequency control input of VCO 310 is driven by the positive input differential signal $V_{cp}$ and the frequency control input of VCO of the 318 is driven by the negative differential signal $V_{cn}$. VCO 310 consists of N fully differential unit cells 312 (312-1, 312-2, . . . , 312-N) connected as shown, forming an N-phase differential ring oscillator. Similarly, VCO 318 consists of N fully differential unit cells 320 (320-1, 320-2, . . . , 320-N) connected as shown, forming an N-phase differential ring oscillator. Each unit cell 312 is further made up of a simple differential amplifier 314, whose bias current is variable at its output through transconductance cells 316 controlled by the input signal $V_{cp}$. The transconductance cells 316 can be built using simple voltage controlled current sources like a single transistor or a current steering differential pair. Depending on the control input $V_{cp}$, cell 316 either pulls out or pushes in current to the amplifiers 314, causing the ring oscillator 310 to oscillate slower or faster, respectively. Each unit cell 320 is further made up of a simple differential amplifier 314, whose bias current is variable at its output through transconductance cells 322 controlled by the input signal $V_{cn}$. Depending on the control input $V_{cn}$, cell 322 either pulls out or pushes in current to the amplifiers 314, causing the ring oscillator 318 to oscillate slower or faster, respectively. The transconductors 316 and 322 connect to an AC ground to implement a fully-differential implementation of frequency control of the VCOs using differential control inputs. In some embodiments, 316 and 322 are implemented as a simple differential amplifier.

Figure 4A:
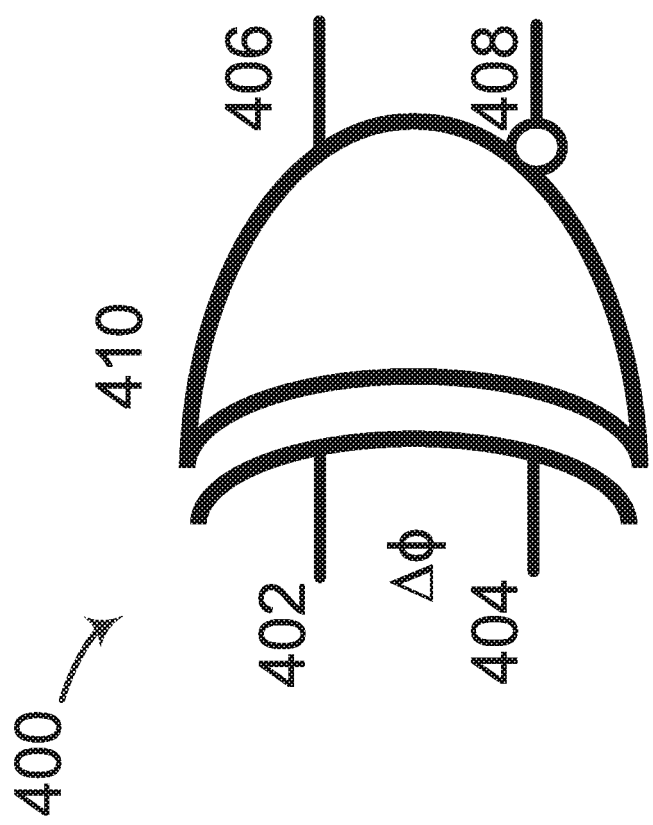
FIG. 4A illustrates a phase detector according to certain embodiments of the present disclosure.

FIG. 4A shows a phase detector 400 according to certain embodiments of the present disclosure. Phase detector 400 uses an exclusive OR (XOR) gate 410. The XOR gate 410 has two inputs, 402 and 404, and two outputs, 406 and 408, where 408 is the inverted version of the 406. In some embodiments, other types of implementation of the phase detector can also be used. The XOR-phase detector has a gain $K_{PD}=1/\pi$ radian/V for a single-ended implementation and $K_{PD}=2\pi$ radian/V for a differential implementation. In practical implementations, the actual gain of the phase detector is given by $K_{PD}*V_{dd}$, where $V_{dd}$ is the supply voltage of the phase detector.

Figure 4B:
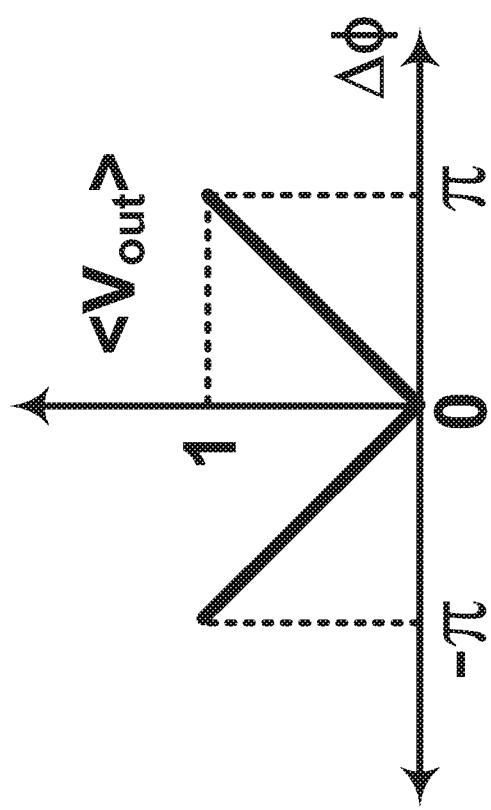
FIG. 4B illustrates the average of the output voltage of the phase detector of FIG. 4A versus the input phase difference according to certain embodiments of the present disclosure.

FIG. 4B illustrates the average of the output voltage $V_{out}$ of the phase detector of FIG. 4A versus the input phase difference $\Delta\phi$ according to certain embodiments of the present disclosure. The useful input phase difference range of the phase detector is between 0 and $\pi$ radians, i.e. 0 and 180 degrees. The input signals 402 and 404 to the phase detector are digital signals and $\Delta\phi$ refers to the phase difference between the two input signals 402 and 404.

Figure 5A:
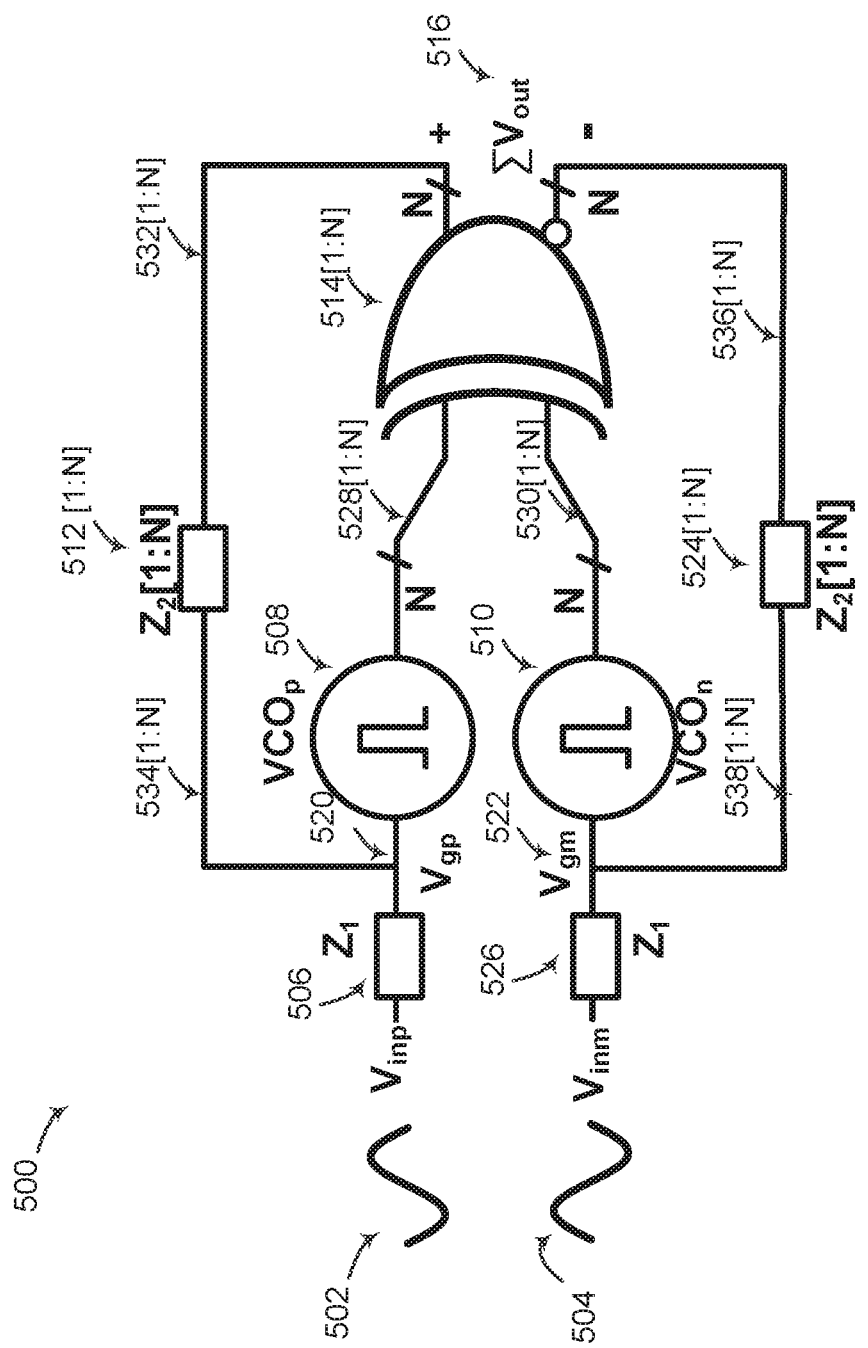
FIG. 5A illustrates a ring oscillator based operational amplifier according to certain embodiments of the present disclosure.

FIG. 5A shows an N-phase ring oscillator based operational amplifier configured as a feedback amplifier 500 according to certain embodiments of the present disclosure. The feedback amplifier 500 includes two impedance elements 506 and 526 with impedance value $Z_1$, and two N-set of impedances elements 512[1:N] and 524[1:N] with impedance value $Z_2$. The impedance elements 506 and 526 can be resistors or capacitors. Similarly, the impedances elements 512[1:N] and 524[1:N] can be resistors or capacitors. For example, in some embodiments, impedance elements 506, 526, 512[1:N], and 524[1:N] are resistors. In some embodiments, impedance elements 506, 526, 512[1:N], and 524[1:N] are capacitors. In some embodiments, impedance elements 506 and 526 are resistors, and impedance elements 512[1:N] and 524[1:N] are capacitors. In some embodiments, impedance elements 506 and 526 are capacitors, and impedance elements 512[1:N] and 524[1:N] are resistors. The input differential signals $V_{inp}$ 502 and $V_{inm}$ 504 are applied to one end of the impedance elements 506 and 526, respectively. The other end of the impedances elements 506 and 526, respectively connects to the virtual ground nodes $V_{gp}$ 520 and $V_{gm}$ 522. Also, connected to $V_{gp}$ and $V_{gm}$ nodes are the control inputs of the two N-phase VCOs: $VCO_p$ 508 and $VCO_n$ 510. The output frequency of the VCOs vary with the voltage at their control inputs, namely nodes $V_{gp}$ and $V_{gm}$, as explained in connection with FIG. 1A. The N-phase outputs of the VCOs are connected to N phase detectors, implemented here as an XOR gate 514[1:N], whose differential outputs drive the impedance elements 512[1:N] and 524[1:N], which connect back to the respective virtual ground nodes $V_{gp}$ and $V_{gm}$, thus forming a closed-loop configuration. In some embodiments, each of the XOR gate 514[1:N] is coupled to respective one phase output of the $VCO_p$, one phase output of the $VCO_m$, one of the impedance element 512[1:N], and one of the impedance element 524[1:N]. For example, the first XOR gate 514[1] is coupled with the first phase output of $VCO_p$, the first phase output of $VCO_m$, the first of the impedance elements 512[1:N], 512[1], and the first of the impedance elements 524[1:N], 524[1]. The $N^{th}$ XOR gate 514[N] is coupled with the $N^{th}$ phase output of $VCO_p$, the $N^{th}$ phase output of $VCO_m$, the $N^{th}$ of the impedance elements 512[1:N], 512[N], and the N$^{th}$ of the impedance elements 524[1:N], 524[N]. In some embodiments, the phase detectors can be implemented by other suitable circuits. The circuit in FIG. 5A forms a closed loop amplifier whose gain is determined by the ratio of the impedance values $Z_1$ and $Z_2$. In some embodiments, the feedback amplifier 500 is also referred to as a closed-loop amplifier. In some embodiments, the amplifier amplifies a continuous-time continuous-amplitude signal to a continuous-time discrete-amplitude signal.

In some embodiments of the present disclosure, each oscillator described in FIGS. 1A, 1B, 5A, and/or 6 include a plurality of N phase outputs. In some embodiments, N is at least two. In some embodiments, N is less than 256. In some embodiments, as described in FIGS. 1A, 1B, 5A, and/or 6, the same number of N phase detectors, quantizers, and/or impedance elements will be used to form an amplifier as appreciated by a person skilled in the art.

Figure 5B:
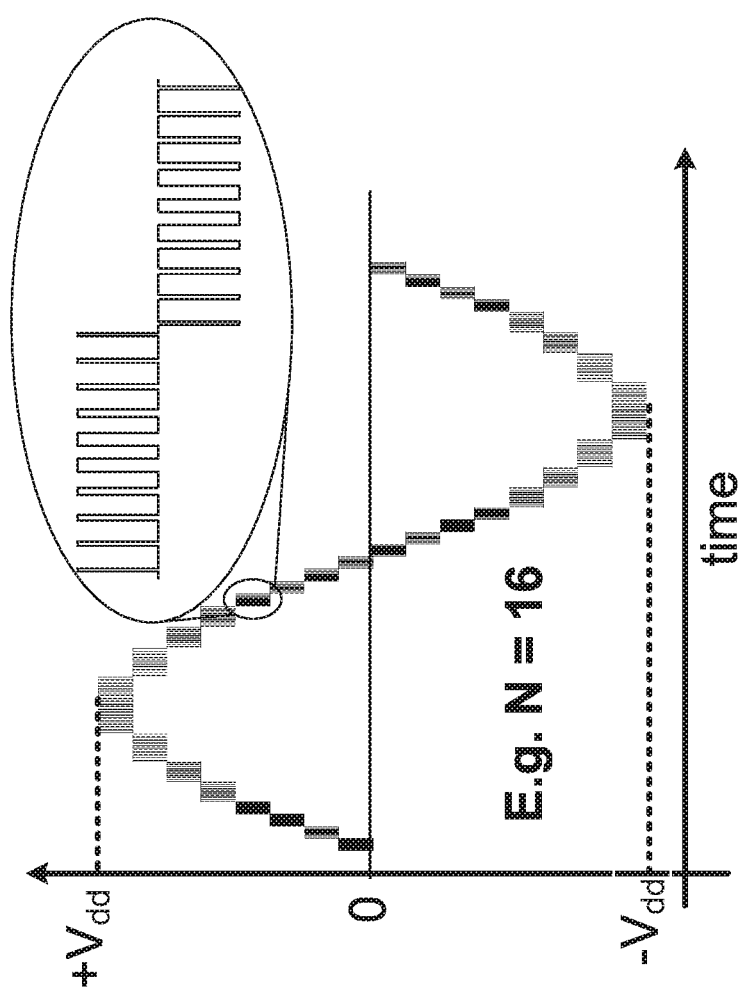
FIG. 5B illustrates an output waveform of a ring oscillator based operational amplifier shown in FIG. 5A.

FIG. 5B shows the example output waveforms for a 16-phase VCO and an XOR phase detector shown in FIG. 5A with the impedance elements 506, 526, 512[1:N], and 524[1:N] being resistors, forming a resistive close-loop amplifier. The x-axis shows time in seconds, and the y axis shows the summed output voltage $\Sigma V_{out}$ in volts. The input $V_{inp}$ and $V_{inm}$ is a sine-wave and the output $V_{out}$ is a rail-to-rail amplified version of the input sine-wave, with the amplification factor being set by the ratio of $Z_2/Z_1$ resistors.

Figure 6:
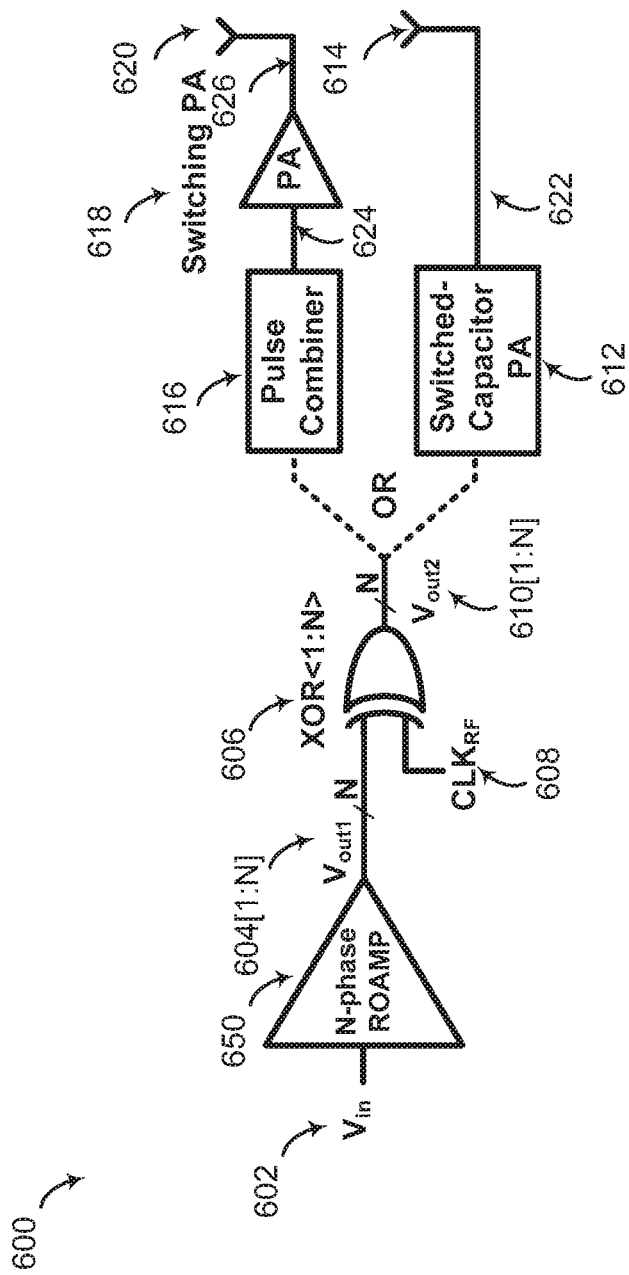
FIG. 6 illustrates a power amplifier system according to certain embodiments of the present disclosure.

The ROAMP described in FIGS. 1A, 1B, and 5A can be used in applications such as power amplifiers. For example, FIG. 6 shows a power amplifier (PA) system 600 according to certain embodiments of the present disclosure. The PA systems 600 includes an N-phase ROAMP 650 and N XOR gates 606[1:N]. The PA system 600 also includes either (1) a pulse combiner 616, a switching PA 618, an antenna 620 or (2) a switched capacitor PA and an antenna 614. In FIG. 6, a single-ended version is shown here for convenience while the actual implemented version can be single-ended or differential. The baseband input signal $V_{in}$ 602 is applied to the input of the N-phase ROAMP 650, which amplifies the input signal and converts it into an N-phase pulse-width modulated output $V_{out1}$ 604[1:N]. ROAMP 650 can be implemented using the closed-loop configuration described in FIG. 5A 500 or the open-loop configuration described in FIGS. 1A and 1B. The N-phase output $V_{out1}$[1:N] is applied to one of the two inputs of N-XOR gates 606[1:N], whose other input is fed by a high-frequency clock signal CLKRF 608. The XOR gates 606[1:N] perform a digital up-conversion of the signal $V_{out1}$ 604[1:N] by translating it from baseband to the RF center frequency, producing the signal $V_{out2}$ 610[1:N]. This upconversion of the input signal from baseband to RF can also be done with any general-purpose mixer, of which XOR gates is one particular implementation. The N-phase output $V_{out2}$ 610[1:N] is now centered around the RF frequency CLKRF 608. $V_{out2}$, which is centered around the RF frequency and is a rail-to-rail switched signal with signal information encoded in the pulse-widths, can: (1) drive a switched-capacitor power-amplifier 612, which converts the N-phase input signals 610[1:N] to a single output 622 that drives the antenna 614 or (2) be fed to a pulse combiner 616, made of using purely digital gates that convert the N-phase input signal 610[1:N] to a single-phase output signal 624 that can then drive a switched-mode power amplifier 618 which drives the antenna 620.

In some embodiments, the switched-capacitor power amplifier (SCPA) 612 can be implemented in the simplest form as described in Sang-Min Yoo et. al, "A Switched-Capacitor RF Power Amplifier," IEEE Journal of Solid-State Circuits, Vol. 46, No. 12, December 2011. SCPAs includes a multi-bit digital input signal that charges and discharges a bank of weighted capacitors, which is then fed to the output to drive the antenna 614 through an impedance transformation network that is part of the SCPA 612. In FIG. 6, the switches of the SCPA that charge and discharge the capacitor bank, which consist of identical capacitors, are driven by the multi-phase signals $V_{out2}$ [1:N] 610. The antenna 614 is driven by the SCPA through an impedance matching network. The impedance matching network is made of a combination of inductors and capacitors and varies according to the required frequency and bandwidth of operation. In some embodiments, the impedance matching network can be a part of the SCPA 612 or a separate block. In some embodiments, the SCPA 612 can be implemented by other suitable circuits.

The pulse combiner 616 can be implemented using a combination of purely digital gates, like NAND and NOR gates, and timed flip-flops like a D-flip flop. The primary purpose of the pulse combiner 616 is to combine the multi-phase signals $V_{out2}$ [1:N] at its input into a single phase output signal 624. The output of the pulse combiner drives a switched-power amplifier 618, like a Class-E/F switching PA as described, for example, in Ichiro Aoki et. al, "A Fully-Integrated Quad-Band GSM/GPRS CMOS Power Amplifier," IEEE Journal of Solid-State Circuits, Volume: 43, Issue: 12, December 2008. A switching power amplifier consists of a RF inductor or choke that charges and discharges the output load (i.e. the antenna 620) through an impedance matching network that form part of the PA. In some embodiments, the impedance matching network can a separate block. The impedance matching network is made of a combination of inductors and capacitors and varies according to the required frequency and bandwidth of operation.

The proposed ROAMP includes several advantages such as large signal swings, large bandwidths, simple analog-to-digital conversion, and area efficiency of the circuit realization. For example, the peak signal swing of the ROAMP is limited only by the minimum pulse width $t_{min}$ that the system can faithfully represent, and is given by Vdd*(1−2$t_{min}/T_{osc}$), where $T_{osc}$ is the fundamental period of oscillation of the oscillators in the ROAMP. In scaled CMOS technologies, due to the availability of faster transistors, $t_{min}$ gets progressively smaller and hence ROAMPs can achieve close to rail-to-rail signal swings.

The bandwidths of the ROAMP is directly proportional to the tuning gain of VCO, $K_V$, and inversely proportional to the delay of the phase detector, $t_{pd}$. With CMOS scaling, it is increasingly easier to build ring oscillators with larger $K_{VS}$ and build phase detectors with smaller delays tpd. Thus, the bandwidths of ROAMPs improves with CMOS scaling.

Pulse-width modulated output of the ROAMP enables simple analog-to-digital conversion using flip-flops. The output of the ROAMP contains signal information in the time-domain encoded as pulse-widths. The output can be sampled using simple digital flip-flops that are clocked using a sample clock to perform quantization. The flip-flops quantize the pulse-widths of ROAMP output in accordance to the sampling clock to produce the digital signal, thus implementing an analog-to-digital converter. Since the output of the ROAMP is a rail-to-rail signal (either Vdd or ground), sampling the output using digital flip-flops to perform quantization is very power-efficient and avoid meta-stability issues inherent in comparator type analog-to-digital converters.

The implementation of ROAMPs is area-efficient. ROAMPs consist of only two VCOs and a digital XOR-gate.

In scaled CMOS technologies, it is very much possible to design compact low area VCOs and digital gates, thus saving area. ROAMPs do not require any resistors and capacitors for compensation, which typically consume a large amount of area in conventional amplifiers.

Throughout the description, where articles, devices, and systems are described as having, including, or comprising specific components, or where processes and methods are described as having, including, or comprising specific steps, it is contemplated that, additionally, there are articles, devices, and systems of the present disclosure that consist essentially of, or consist of, the recited components, and that there are processes and methods according to the present disclosure that consist essentially of, or consist of, the recited processing steps.

It should be understood that the order of steps or order for performing certain action is immaterial so long as the disclosure remains operable. Moreover, two or more steps or actions may be conducted simultaneously.

The mention herein of any publication, for example, in the Background section, is not an admission that the publication serves as prior art with respect to any of the claims presented herein. The Background section is presented for purposes of clarity and is not meant as a description of prior art with respect to any claim.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out the several purposes of the disclosed subject matter. It is important, therefore, that the claims be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter, which is limited only by the claims which follow.

What is claimed:

1. A closed loop amplifier, comprising:
   a first oscillator having an input and a plurality of N outputs;
   a second oscillator having an input and a plurality of N outputs;
   a plurality of N phase detectors, each of the plurality of N phase detectors has a first input, a second input, a first output, and a second output, wherein each first input of each phase detector is coupled to respective one of the plurality of N outputs of the first oscillator, wherein each second input of each phase detector is coupled to respective one of the plurality of N outputs of the second oscillator;
   a first impedance element having two terminals, wherein one terminal is coupled to the input of the first oscillator;
   a second impedance element having two terminals, wherein one terminal is coupled to the input of the second oscillator;
   a plurality of N third impedance elements, each of the plurality of N third impedance elements has a first terminal and a second terminal, wherein each first terminal of each third impedance element is coupled to the input of the first oscillator, wherein each second terminal of each third impedance element is coupled to respective one first output of the plurality of N phase detectors; and
   a plurality of N fourth impedance elements, each of the plurality of N fourth impedance elements has a first terminal and a second terminal, wherein each first terminal of each fourth impedance element is coupled to the input of the second oscillator, wherein each second terminal of each fourth impedance element is coupled to respective one second output of the plurality of N phase detectors,
   wherein the closed loop amplifier amplifies a continuous-time continuous-amplitude signal to a continuous-time discrete-amplitude signal.

2. The amplifier of claim 1, wherein at least one of the first oscillator or the second oscillator is a voltage controlled oscillator.

3. The amplifier of claim 1, wherein at least one of the first oscillator or the second oscillator is a current controlled oscillator.

4. The amplifier of claim 1, wherein at least one of the first oscillator or the second oscillator is a ring oscillator.

5. The amplifier of claim 1, wherein at least one of the first oscillator or the second oscillator is a single-ended oscillator.

6. The amplifier of claim 1, wherein the first oscillator and the second oscillator form a differential oscillator.

7. The amplifier of claim 1, wherein at least one of the plurality of N phase detectors is an exclusive OR gate.

8. The amplifier of claim 1, wherein the first impedance element and the second impedance element have the same impedance value.

9. The amplifier of claim 1, wherein each of the plurality of N third impedance elements and each of the plurality of N fourth impedance elements have the same impedance value.

10. The amplifier of claim 1, wherein the first impedance element and the second impedance element are resistors.

11. The amplifier of claim 1, wherein the first impedance element and the second impedance element are capacitors.

12. The amplifier of claim 1, wherein each of the plurality of N third impedance elements and each of the plurality of N fourth impedance elements are resistors.

13. The amplifier of claim 1, wherein each of the plurality N third impedance elements and each of the plurality of N fourth impedance elements are capacitors.

* * * * *